United States Patent
Lo et al.

(10) Patent No.: US 6,232,787 B1
(45) Date of Patent: May 15, 2001

(54) MICROSTRUCTURE DEFECT DETECTION

(75) Inventors: Chiwoei Wayne Lo, Campbell; Pierre Perez, Cupertino, both of CA (US)

(73) Assignee: Schlumberger Technologies, Inc., San Jose, CA (US)

( * ) Notice: Subject to any disclaimer, the term of this patent is extended or adjusted under 35 U.S.C. 154(b) by 0 days.

(21) Appl. No.: 09/226,962

(22) Filed: Jan. 8, 1999

(51) Int. Cl.[7] .................................................... G01R 31/28

(52) U.S. Cl. ......................... 324/751; 324/752; 250/310; 250/311

(58) Field of Search .................................. 324/750, 751, 324/752; 250/310, 311

(56) References Cited

U.S. PATENT DOCUMENTS

| | | | |
|---|---|---|---|
| 4,943,769 | * 7/1990 | Golladay et al. | 324/158.1 |
| 5,401,972 | 3/1995 | Talbot et al. | 250/491.1 |
| 5,493,116 | 2/1996 | Toro-Lira et al. | 250/310 |

(List continued on next page.)

OTHER PUBLICATIONS

Thong, John T.L., "Electron Beam Testing Technology", Microdevices Physics and Fabrication Technologies, pp. 41–62.

Pfeiffer, H.C. et al., "Advanced Deflection Concept For Large Area, High Resolution E–Beam Lithography", J. Vac. Sci. Technol., vol. 19, No. 4, Nov./Dec. 1981, pp. 1058–1063.

Saitou, Norio et al., "Variably Shaped Electron Beam Litography System, EB55: II Electron Optics", J. Vac. Sci. Technol., vol. 19, No. 4, Nov./Dec. 1981, pp. 1087–1093.

Thomson, M.G.R., "The Electrostatic Moving Objective Lens And Optimized Deflection Systems For Microcolumns", J. Vac. Sci. Technol. B, vol. 14, No. 6, Nov./Dec. 1996 pp. 3802–3807.

(List continued on next page.)

Primary Examiner—Safet Metjahic
Assistant Examiner—Jimmy Nguyen
(74) Attorney, Agent, or Firm—Skjerven Morrill MacPherson LLP

(57) ABSTRACT

Methods of inspecting a microstructure comprise: applying charged particles to the wafer to negatively charge up the wafer over a region having contact or via holes, scanning a charged-particle beam over the region while detecting secondary particles so as to produce a detector signal, determining from the detector signal an apparent dimension of a contact hole, and comparing the apparent dimension of the contact hole with reference information to identify a defect. The reference information can be a conventional voltage-contrast image or can be design data indicating expected physical size of the contact hole and expected electrical connectivity of material within or beneath the contact hole. The wafer can be charged up by directing a flood of electrons toward a surface of the wafer and/or by controlling potential of an energy filter so as to direct secondary electrons back to the wafer while directing a charged-particle beam at the wafer. Other methods of inspecting a microstructure comprise charging up a microstructure, interrogating the microstructure with a charged-particle beam to obtain apparent dimensional information for a feature of the microstructure, and comparing the apparent dimensional information with reference information about the microstructure to identify a defect. Apparatus for inspecting semiconductor wafers and other microstructures are also disclosed, as are computer program products comprising a computer usable media having computer-readable program code embodied therein for controlling a charged-particle-beam system for inspecting a microstructure.

42 Claims, 8 Drawing Sheets

U.S. PATENT DOCUMENTS

| | | | |
|---|---|---|---|
| 5,502,306 | 3/1996 | Meisburger et al. | 250/310 |
| 5,521,517 * | 5/1996 | Shida et al. | 324/751 |
| 5,578,821 | 11/1996 | Meisberger et al. | 250/310 |
| 5,592,099 * | 1/1997 | Kuribara et al. | 324/751 |
| 5,602,489 * | 2/1997 | El Dareh et al. | 324/75.1 |
| 5,844,416 * | 12/1998 | Campbell et al. | 324/750 |
| 5,866,904 * | 2/1999 | Todadoro et al. | 250/310 |
| 5,969,357 * | 10/1999 | Todokoro et al. | 250/310 |
| 6,002,792 * | 12/1999 | Oguri et al. | 324/750 |

OTHER PUBLICATIONS

Jenkins, Keith A. et al., "Analysis Of Silicide Process Defects By Non–Contact Electron–Beam Charging", IEEE Electron Devices Society and IEEE Reliability Society 30th Annual Proceedings, 1992, (IEEE Catalog No. 92CH3084–1), pp. 304–308.

Munro, E. "Design And Optimization Of Magnetic Lenses And Deflection Systems For Electron Beams", J. Vac. Sci. Technol., vol. 12, No. 6, Nov./Dec. 1975, pp. 1146–1150.

Pfeiffer, Hans C., "Recent Advances In Electron–Beam Litography For The High–Volume Production Of VLSI Devices", IEEE Transactions on Electron Devices, vol. ED–26, No. 4, Apr. 1979, pp. 663–674.

Aton, T.J. et al., "Testing Integrated Circuit Microstructures Using Charging–Induced Voltage Contrast", J. Vac. Sci. Technol. B, vol. 8, No. 6, Nov./Dec. 1990, pp. 2041–2044.

Cass, Thomas R., "Use Of The Voltage Contrast Effect For The Automatic Detection Of Electrical Defects On In–Process Wafers", Technology Development Center, ICBD, Hewlett–Packard Co., pp. 506–1–506–11.

Goto, Eiichi et al., "MOL (moving objective lens) Formulation of Deflective Aberration Free System", Optik, vol. 48, No. 3 (1977), pp. 255–270.

* cited by examiner

MICROSTRUCTURE DEFECT DETECTION

RELATED APPLICATIONS

This application is related to co-pending U.S. patent application Ser. No. 08/892,734 filed Jul. 15, 1997, U.S. patent application Ser. No. 08/782,740 filed Jan. 13, 1997, U.S. patent application Ser. No. 09/012,227 filed Jan. 23, 1998, U.S. patent application Ser. No. 09/227,747 filed on the same date as this application and U.S. patent application Ser. No. 09/226,967 filed on the same date as this application, the contents of which are incorporated herein by this reference.

BACKGROUND

1. Field of the Invention

The invention relates to inspection of microstructures, particularly for detection of defects in partially-fabricated microcircuits with the aid of a charged-particle-beam system.

2. The Prior Art

Various techniques are used to inspect for defects in microstructures such as partially-fabricated microcircuits. For example, optical inspection systems create an image of a microcircuit which is inspected for anomalies. However, such images have insufficient resolution to enable identification of the smallest features, offer insufficient distinction of defects which are electrically significant from those which are not, and have insufficient depth of focus for detection of sub-surface defects. Charged-particle-beam inspection systems have advantages over optical inspection systems when inspecting microcircuits fabricated with critical-dimension technology of 0.35 micron and smaller. Charged-particle-beam inspection has sufficient resolution to image small features such as contact holes, gates, and polysilicon lines, and can be used to detect killer defects based on voltage contrast. Floating conductors and conductors connected to n-diffusion regions should have higher or lower voltage than grounded conductors and conductors connected to p-diffusion regions. In a voltage contrast image, the latter typically appear darker than the former. An electrical defect can be identified in a voltage-contrast image if it causes a feature to appear brighter or darker than expected.

However, it is difficult to obtain a good voltage-contrast image of a microstructure having a high aspect ratio, such as the bottom of a contact hole which is deep relative to its width. While a voltage-contrast image normally shows obvious contrast differences between structures connected to ground, n-diffusion regions, p-diffusion regions, and gate regions, high-aspect-ratio structures do not. Instead, the bottom of a high-aspect-ratio structure appears in low contrast due to obstruction of secondary electrons by the side walls of the structure and consequent charging-up of the side walls.

An example of such a high-aspect-ratio structure is a contact hole of a wafer in an intermediate stage of fabrication. After preparing structures such as grounded regions, n-diffusion regions, p-diffusion regions and gate regions, they are covered with dielectric and contact holes are formed in the dielectric at appropriate locations so that conductors of a subsequent metal layer can make electrical contact with these regions. Because of the high aspect ratio of the contact holes, a voltage contrast image obtained using a high beam current has insufficient contrast to distinguish the regions.

Charged-particle-beam systems, such as scanning-electron microscopes in critical-dimension-measurement systems, can be operated at very low beam current for contact-hole imaging to prevent charging of the side wall. However, this imposes a limit on throughput of the system and results in diminished voltage contrast because beam current is insufficient to charge up the structures of interest. Imaging is also slow due to shot noise (current fluctuation caused by the discrete nature of electron charge).

U.S. Pat. No. 5,493,116 describes electron-beam imaging of high-aspect-ratio structures such as contact holes using two signal detection sub-systems, one optimized for imaging at the top and another optimized for imaging at the base of sub-micrometer structures. Signals produced by the detection sub-systems are combined to produce an image resembling extended focus images obtained with confocal optical microscopes.

Improved methods and apparatus are needed for detection of defects in microstructures and especially in semiconductor wafers carrying portions of microcircuits in fabrication.

SUMMARY

Methods of inspecting a microstructure in accordance with some embodiments consistent with the invention comprise: applying charged particles to the wafer to negatively charge up the wafer over a region having feedthrough holes such as contact or via holes, scanning a charged-particle beam over said region while detecting secondary particles so as to produce a detector signal, determining from the detector signal an apparent dimension of a feedthrough hole, and comparing the apparent dimension of the feedthrough hole with reference information to identify a defect. The reference information can be a conventional voltage-contrast image or can be design data indicating expected physical size of the contact or via hole and expected electrical connectivity of material within or beneath the contact or via hole. The wafer can be charged up by directing electrons from a flood gun or primary beam toward a surface of the wafer and/or by setting potential of an energy filter so as to direct secondary electrons back to the wafer while directing a charged-particle beam at the wafer.

Other methods of inspecting a microstructure in embodiments consistent with the invention comprise charging up a microstructure, interrogating the microstructure with a charged-particle beam to obtain apparent dimensional information for a feature of the microstructure, and comparing the apparent dimensional information with reference information about the microstructure to identify a defect. Interrogating the microstructure can comprise scanning a charged-particle-beam over a surface region of the microstructure while detecting charged particles emanating from the surface region to create a voltage-contrast image of the surface region. Comparing the apparent dimensional information with reference information about the microstructure can comprise comparing apparent size of the feature with an expected size and/or determining whether apparent size of the feature is consistent with expected electrical connectivity of material within or beneath the feature and/or comparing apparent size of the feature with apparent size of the feature in a conventional voltage-contrast or SEM image.

Embodiments consistent with the invention can include apparatus for inspecting microstructures, computer-readable media containing instructions for controlling a charged-particle-beam system to perform a method for inspecting a semiconductor wafer, and computer program products comprising a computer usable media having computer-readable program code embodied therein for controlling a charged-particle-beam system for inspecting a microstructure.

These and other features consistent with the invention will become apparent to those of skill in the art from the following description and the accompanying drawing figures.

DETAILED DESCRIPTION

Figure 1:
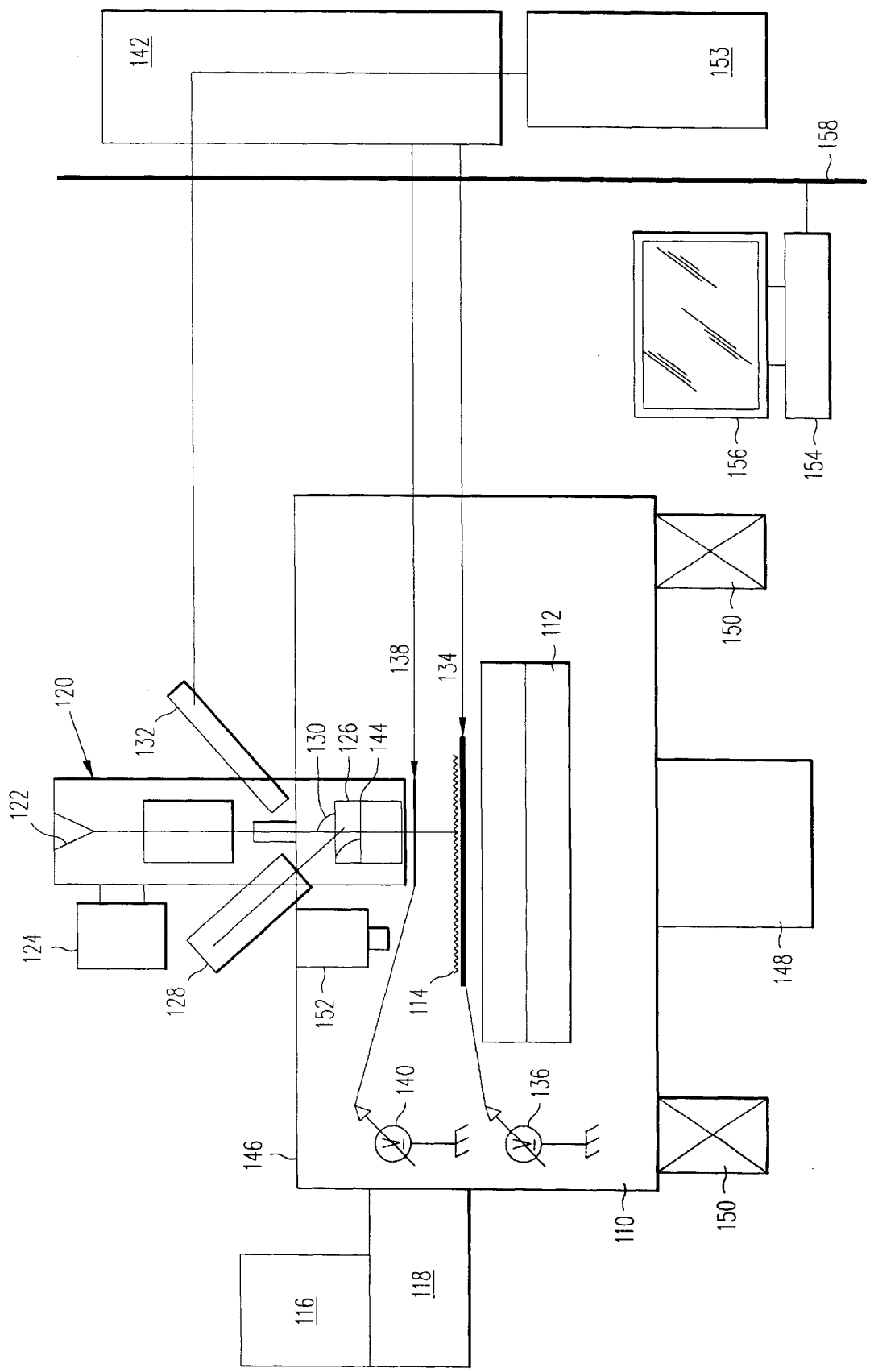
FIG. 1 is a schematic diagram of a charged-particle-beam system useful in carrying out methods consistent with the present invention.

FIG. 1 is a schematic diagram of a charged-particle-beam system useful for carrying out inspection of microstructures in a manner consistent with the present invention. Also suitable is a system as shown and described in U.S. patent application Ser. No. 08/892,734 filed Jul. 15, 1997. In FIG. 1, a vacuum chamber 110 houses an x,y,θ wafer-handling stage 112 carrying a semiconductor integrated circuit (IC) wafer 114 on a sample plate. A wafer-handling unit having a wafer cassette 116 for carrying multiple wafers and a wafer loadlock 118 with wafer-handling robots (not shown) operating in vacuum and air are provided for rapid installation of wafers on and removal of wafers from stage 112. The system includes a scanning-electron-microscope column 120, for example, similar to that used in IC electron-beam-probing systems such as the IDS 10000 system available from the Automated Test Equipment division, Schlumberger Technologies, Inc., of San Jose, Calif. Column 120 has an electron gun with a conventional Thermal Field emission (TFE) electron source 122. The electron gun is pumped directly by an ion pump 124. The electron gun has a high vacuum relative to the rest of column 120 and separated from the rest of column 120 by a differential pumping aperture, as is the case in most modern SEMs. The primary beam landing energy can be adjusted, for example, from 700 eV to 1.5 keV. Beam current at the specimen can be adjusted using a condenser lens and beam limiting aperture in a range, for example, from ~500 pA to ~10 nA or more. Column 120, combined with the wafer chuck bias and extraction electrode described below, form a Local Charge Control Module (LCCM).

Column 120 advantageously includes a large field-of-view (FOV) variable-axis immersion lens (VAIL) 126, similar in construction to that used in the Schlumberger IDS 5000 and IDS 10000 electron-beam probing systems. The lens is a magnetic-immersion type where the specimen is held (+/−) at the point of maximum axial magnetic field. The lens field thus acts as a "magnetic bottle" and allows for collimation and efficient collection of secondary electrons without the need to apply a strong electrostatic collection field. Such a field may cause unstable surface charging, precluding independent optimization of the wafer bias, extraction potential and energy filter to enhance voltage contrast. The lens is equipped with both pre-deflection and deflection coils to achieve a large, high-resolution (e.g., 30 nm to 100 nm) field of view of, for example 0.25 mm to 1.5 mm.

The objective lens assembly is equipped with an "in-the-lens" flood gun 128 and flood-beam bending electrode 130 which allows fast multiplexing between a broad, high-current flood beam to pre-charge the specimen and conductors, and a high-resolution primary-imaging beam for fast imaging (typically 10 MHz to 100 MHz) to interrogate conductor charge states. The flood gun implementation is described, for example, in U. S. patent application Ser. No. 09/012,277, filed Jan. 23, 1998. Flood gun 128 along with the wafer chuck bias and extraction electrode described below form a Global Charge Control Module (GCCM). The GCCM is used for large-area charging while the LCCM is used for localized charging.

Secondary electrons, and in general other secondary particles generated at the surface of the specimen as the primary beam is raster-scanned, are detected to produce a detector signal which is processed to form an image of the specimen. These secondary electrons are collected by the lens field, travel back through the bore of the lens and are separated from the primary electron beam with a Wien filter (having crossed magnetic and electric fields). Secondary electrons are then detected by an electron detector 132, such as a scintillator-photomultiplier tube (PMT) combination, also known as an Evahart-Thornley detector. Other detector combinations can also be used. Provision is included to shield the electron detector to prevent damage or rapid aging from the strong secondary electron current generated when the flood beam is in use, for example as described in U.S. patent application Ser. No. 09/012,277, filed Jan. 23, 1998.

Wafer-handling stage 112 includes a wafer chuck 134 to which a bias voltage is applied as indicated schematically by source 136. A bias voltage is also applied to extraction electrode 138 as indicated schematically by source 140. The bias voltages applied to wafer chuck 134 and extraction electrode 138 are independent of one another; their levels are set by control electronics 142 to optimize voltage contrast depending on the type of wafer being imaged and the type of defect to be detected. The wafer surface can be charged-up positively or negatively as desired, as described for example in co-pending U.S. patent application Ser. No. 08/892,734 filed Jul. 15, 1997 and U.S. patent application Ser. No. 09/012,277 filed Jan. 23, 1998. The wafer bias voltage can also be used to independently vary the beam-landing energy, a desirable capability for some specimens with thin layers, such as salicide layers, which require low beam-landing energy (without compromising imaging resolution) to prevent charge leakage to other layers from beam punch-through.

The bore of lens 126 is equipped with a planar retarding field electron energy spectrometer, such as used in the Schlumberger IDS 5000 & IDS 10000 electron-beam probing systems. The spectrometer has a energy-filter-mesh electrode 144 which can be used to optimize voltage contrast for certain wafer types by collecting secondary electrons within a specified energy range, such as 0 eV to ~15eV.

A fast wafer stage 112 capable of handling, for example, a 300 mm wafer, allows access to the whole of the wafer to be inspected. The wafer is supported on an electrostatic-type wafer chuck 114. In general the stage used should be vacuum-environment compatible, non-magnetic to minimize unwanted beam deflection, clean-room compatible and reasonably accurate. There is a direct trade-off between stage accuracy and image-alignment processing overhead. A short settling time, such as <0.3 s, after each mechanical move is desirable for throughput, as are high-speed (~100 mm/s) and precise (~0.1 um laser interferometer feedback) stage movement. To assure ~0.1 um feedback accuracy the mechanical path between the stage and column should be extremely rigid. For example, the top 146 of vacuum chamber 110 is used as a metrology plate and is fabricated of 5" thick aluminum re-enforced with an external H-frame. Column 120 and precision stage 112 are directly mounted on the metrology plate to minimize relative motion. A laser interferometer, not illustrated, provides accurate position feedback to the stage-motor controllers. More subtle position errors, also detected by the interferometer, are corrected by small beam deflections under control of control electronics 142.

Vacuum chamber 110 is pumped directly by a turbo pump and oil-free backing pump, shown collectively at 148. The chamber is mounted on an active vibration isolation platform shown schematically at 150, to cancel environmental vibration and to predictively cancel motion due to fast stage acceleration and deceleration. Vacuum load-lock system 118 minimizes wafer changeover time, allowing main vacuum chamber 110 to stay at high vacuum (e.g., 1E–6 Torr) for long periods and minimizing contamination of the wafer from hydro-carbons.

Provision is made for completely automatic loading and unloading of wafers. Two wafer robots (not shown) may be used. The first robot moves wafers from a cassette 116 to the load-lock chamber 118. The load-lock chamber is evacuated and a second vacuum robot places the wafer on precision stage 112. Load-lock chamber 118 can accommodate several wafers, thus facilitating pipeline operation and parallel loading and unloading of wafers. The wafer handling subsystem advantageously includes an optical wafer pre-aligner to assure some minimum level of wafer pre-alignment accuracy on wafer stage 112.

An optical alignment system including an optical microscope 152 with CCD video camera and image-pattern matching system (e.g., as available commercially from Cognex or other vendors), is used to facilitate accurate alignment of the wafer once on the precision stage. For some semiconductor process layers the wafer and die fiducial marks may appear in low contrast in the electron-beam image, making electron-beam image-based alignment unreliable. Optical microscopes can be used to see through insulating layers such as SiO2, Si3N4, making the alignment process more robust. This approach is standard on critical-dimension scanning-electron microscopes (CD SEMs) such as KLA 8100 systems and Schlumberger IVS 220 systems.

A multiprocessor-array image-processing computer 153, such as commercially-available from Mercury Computer Systems, is used for image alignment and comparison. For example, image-processing computer includes video-signal input and output boards, as an array of 32 300 MHz PowerPC processors, 4 GBytes of RAM and a ~200 Gbyte disk store for storing reference images and defect data. Image-processing computer 153 implements a range of image processing algorithms including but not limited to: cell to cell comparison for memories, die to die or reference for random logic, and feature-based comparison of images for contacts and other layers (such as described in co-pending U.S. patent application Ser. No. 09/227,747 filed on the same date at this application.

The system includes a control computer 154 with display 156 and input and output devices (not shown). Control computer can be, for example, a personal computer with an Intel Pentium-class processor running the Microsoft Windows NT operating system and having user interface devices such as a keyboard and mouse and control software for communication via bus 158 with control electronics 142 and image-processing computer 153. Control electronics 142 operates under control of control computer 154 and provides signals to drive all of the system elements described. To avoid complicating the illustration, details of the control connections are not shown in FIG. 1. Control computer 154 has, for example, a multi-level, easy to use, graphical user interface and a library of pre-defined stored defect recipes which facilitate use by less-skilled operators in an automated semiconductor-fab environment, as well as use by more-highly-skilled engineers in a laboratory or process-development environment. System control, image processing, beam setup, beam alignment, auto-focus and auto-astigmatism correction are, for example, automated under software control by control computer 154.

If flood gun 128 in the GCCM is operated at a voltage between the two cross-over energies of the surface secondary-electron emission characteristic, the specimen surface is always charged up positively in the absence of an external electric field. Extraction electrode 138 can be a grid or a plate with one or more apertures. The wafer is placed on and in electrical contact with wafer chuck 114. The wafer is charged up by applying an electric field perpendicular to the surface of the wafer, e.g., by applying different voltages to wafer chuck 114 and extraction electrode 138. During flood, any electrically-floating portion of the irradiated wafer surface charges to a pre-determined positive or negative voltage relative to the wafer's substrate. The LCCM is similar to the GCCM except that it has a focused beam rather than a flood gun. The focused beam can be used to selectively charge up smaller areas or structures than the GCCM.

An alternative scheme for negatively charging-up floating portions of the sample in a controlled manner is flooding with ultra-low-voltage electrons having a few volts relative to the sample, e.g., 20 V. When irradiating with an ultra-low-voltage beam, the surface charges up negatively because of very low secondary-electron yield. Charging reaches equilibrium when the surface potential is negative enough to repel the incoming flood-electrons. Ultra-low-voltage electrons should be focused within the gun. The electrons are retarded before they reach the sample surface.

Figure 2:
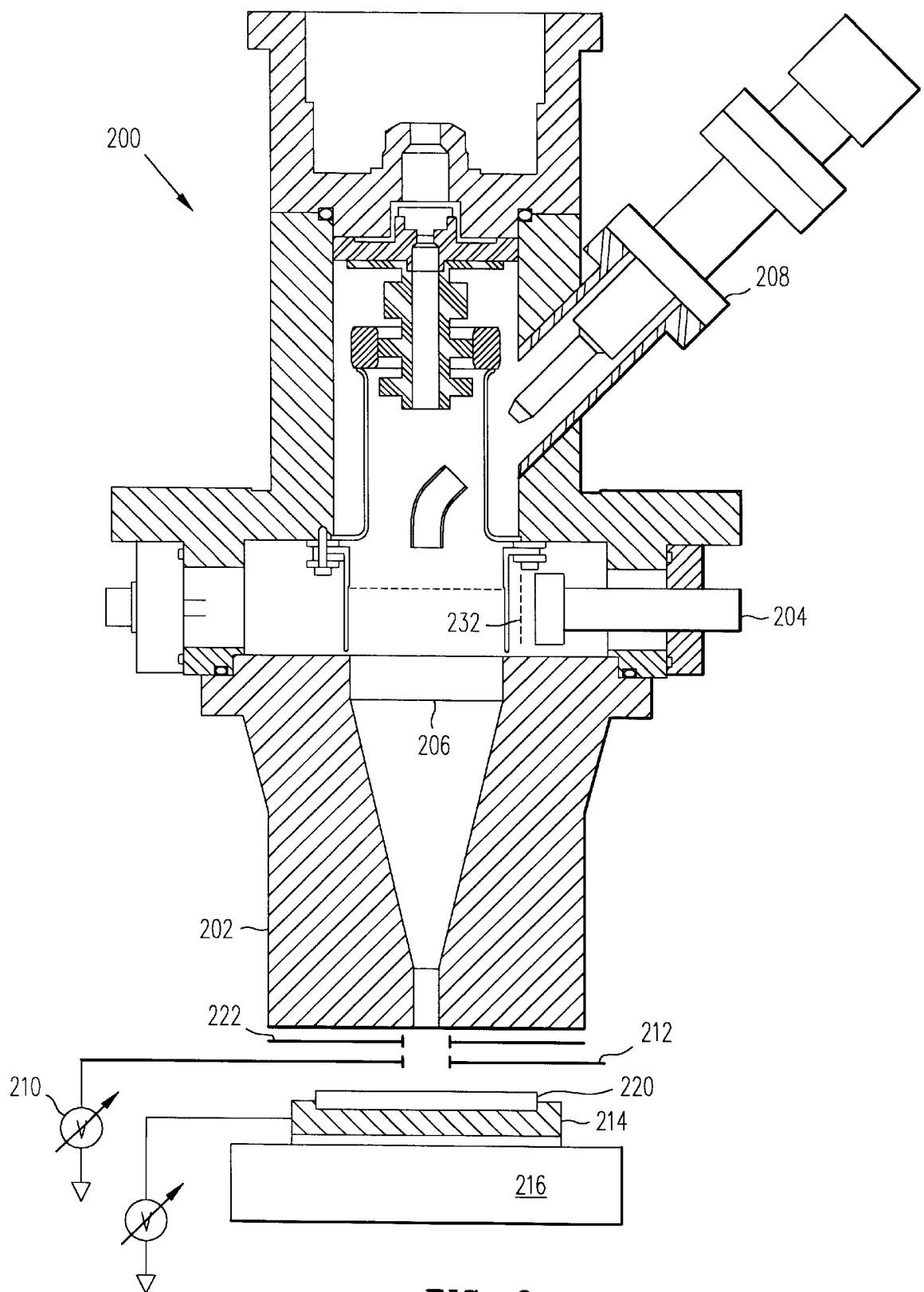
FIG. 2 shows in partial sectional view the objective lens end of a charged-particle-beam column useful in carrying out methods consistent with the present invention.

FIG. 2 shows in partial sectional view the objective lens end of a modified column 200 from a Schlumberger IDS 10000 system. Modified column 200 includes a column objective lens 202, a secondary electron detector 204 and an energy filter mesh 206 (e.g., filter mesh 144 of FIG. 1) connected to a voltage source (not shown) which can be set to determine the energy of secondary electrons reaching detector 204. The system also includes a flood gun 208 with an Einzel lens (not shown), a bias-electrode grid 212 connected to a voltage source 210, a sample plate 214 and a high-accuracy wafer stage 216 carrying a wafer 220. During operation of the GCCM, a high secondary-electron current can blind detector 204. To prevent this, a grid 232 (or an aperture plate or tube) can be placed in front of detector 204. A negative voltage can be applied to grid 232 during flooding to prevent secondary electrons from entering detector 204. Alternatively, a metal plate 222 (called a flooding mask) having a large hole is placed near the entrance of the objective lens 200 and connected to a voltage source (not shown). A negative voltage can be applied to metal plate 222 during flooding to prevent secondary electrons from entering detector 204.

Systems such as shown in FIGS. 1 and 2 are capable of charging the surface of a wafer in a safe and regulated manner. When operating in negative voltage-contrast mode, an electric field is generated during charging in the direction opposing secondary electron emission from the wafer (to attract secondary electrons back to the wafer): for instance, by grounding the charge-control bias electrode 138 and applying a positive voltage to the wafer chuck 114, or by otherwise applying a voltage differential such that the charge-control bias electrode 138 is at a more negative potential than the wafer. When operating in positive voltage-contrast mode, an electric field is generated during charging in the direction assisting secondary electron emission from the wafer (to direct secondary electrons away from the wafer): for instance, by grounding the charge-control bias electrode 138 and applying a negative voltage to wafer chuck 114, or by otherwise applying a voltage differential such that the charge-control bias electrode 138 is at a more positive potential than the wafer. In positive voltage-contrast mode, energy-filter mesh 144 (206) can be biased to accept all secondary electrons.

After charging the wafer, a finely-focused beam is used to interrogate the surface voltage. Since the charging potential of a structure is affected by its connection to the underlying circuit, the voltage contrast technique can be used to find defects which are not visible with prior charged-particle or optical microscope techniques. In general when comparing the contrast of two structures made of the same materials, the darker structure has a more positive potential. For instance, with positive-voltage-contrast imaging, the electrically-floating metal lines in a wafer appear darker than do grounded metal lines under a low-voltage microscope because the potential on the floating lines builds up more positively during charging.

When inspecting a filled-contact wafer using negative voltage contrast, contacts connected to ground appear darker in contrast than those connected to a floating gate because potential at the gate can build up negatively. Contacts connected to n-diffusion regions or to ground have similar contrast because a forward bias is established at the diffusion junction prevents the potential at the diffusion from building up negatively. A short fault at the gate or open fault between the contacts and the diffusion can be identified because it causes the contrast to be different than expected.

Figure 3:
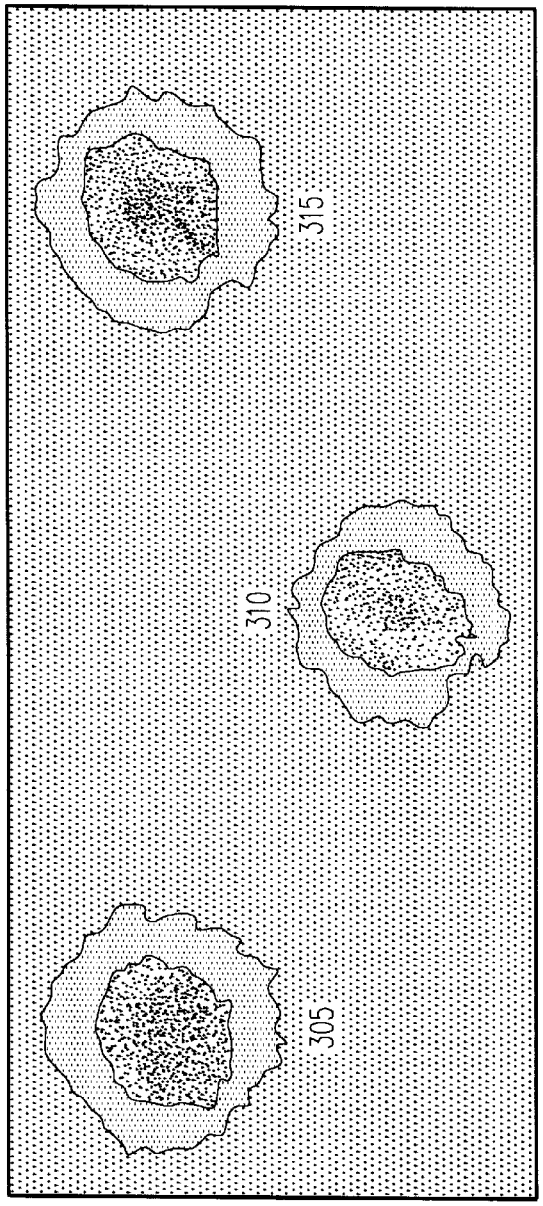
FIG. 3 is a conventional voltage-contrast image showing representations of wafer contact holes of comparable dimensions and differing electrical connectivity.

This contrast-based defect-detection scheme, however, is difficult to apply to inspection of the bottom of high-aspect ratio micro-structures, such as unfilled contact holes. High-aspect-ratio micro-structures such as contact holes act as secondary-electron traps which capture secondary electrons inside the holes, so the bottom of the contact hole appears in much lower contrast than the upper surface of the micro-structure. As a result, all contact holes have similar contrast (very dark) in the voltage-contrast images, regardless of their underlying electrical connections. For example, FIG. 3 is a voltage-contrast image, acquired with a system as described above operating in positive-voltage-contrast mode (as with normal operation of other prior-art systems). The image of FIG. 3 is of a region of a wafer showing features 305, 310 and 315, all of which are voltage-contrast representations of contact holes having substantially identical physical diameter and depth, but having material of different electrical connectivity at the base of each hole. The contact-hole representations of FIG. 3 exhibit no characteristics which allow them to be distinguished by electrical connectivity, though material at the base of one contact hole connects to an n-diffusion region, material at the base of another connects to a gate region, and material at the base of the third to a p-diffusion region. Conventional voltage-contrast imaging as in FIG. 3, in which the wafer surface is positively charged, fails to provide information regarding the underlying electrical connectivity of the material at the base of the unfilled contact hole.

It is possible, however, to perform voltage contrast imaging consistent with the invention in a manner which allows contact holes to be distinguished according to electrical connectivity. In methods consistent with the invention, a wafer is negatively charged-up prior to voltage-contrast imaging. With imaging parameters appropriately adjusted, the resulting electric field of the charged-up structure causes a change in the appearance of high-aspect-ratio features in a voltage-contrast image, because the electric field induced by a charged-up structure extends beyond the physical feature dimensions. Configuring a system to inspect high-aspect-ratio microcircuit structures in this manner allows operation at high beam current for greater throughput.

Figure 4:
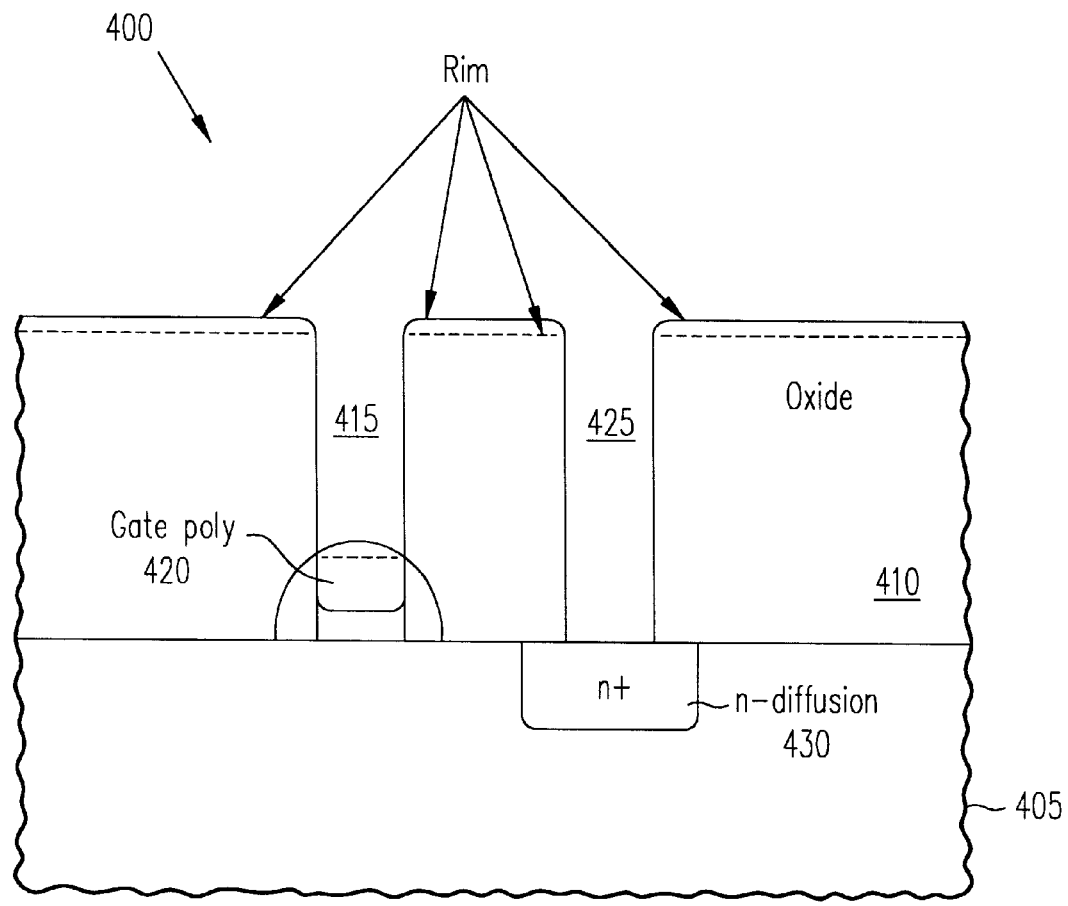
FIG. 4 shows in cross-sectional view a wafer portion with examples of high-aspect-ratio contact holes.

FIG. 4 shows in cross-sectional view a portion 400 of a wafer with examples of high-aspect-ratio contact holes. Substrate 405 is covered with an oxide layer 410. A contact hole 415 through oxide layer 410 exposes a polysilicon gate contact 420. A contact hole 425 through oxide layer 410 exposes an n-diffusion region 430. Contact holes 415 and 425 are of substantially the same diameter and depth, but with material at the base of each having different electrical connectivity. The surface of the wafer is charged-up negatively, as represented by the dashed lines near the upper surface of the structure. The negatively-charged surface results in an electric field around the rim of each contact hole which affects the appearance of the contact hole in a voltage-contrast image. Because the voltage at the rim of each contact hole is also affected by the voltage at the bottom of the contact hole, contact holes having different electrical connectivity have different apparent sizes in a voltage-contrast image. When the surface of the wafer is charged-up negatively, the polysilicon gate contact 420 at the bottom of contact hole 415 is also charged-up negatively, but n-diffusion region 430 at the bottom of contact hole 425 remains near ground potential because of forward bias on the n-diffusion region (to turn on the underlying p-n junction). The near-ground potential of n-diffusion region 430 at the bottom of contact hole 425 brings down the potential at the rim of contact hole 425 relative to the rim of contact hole 415. Lower potential at the rim of contact hole 425 causes contact hole 425 to have a larger apparent size than contact hole 415 in a voltage-contrast image, due to differing electric fields at the respective contact hole rims. (The electric-field effect is described in more detail below.)

Figure 5:
FIG. 5 is a feature-enlarged voltage-contrast image of a wafer region prepared in a manner consistent with the present invention.

For example, FIG. 5 is a voltage-contrast image of a region of a wafer showing features 505, 510 and 515, all of which are voltage-contrast representations of the same contact holes shown in FIG. 3. The image of FIG. 5 was acquired by operating the system in negative-voltage-contrast mode, with −5 volts applied to the wafer via the wafer chuck and with the charging-control bias electrode at ground potential. Feature 505 is of the largest diameter, as material at the bottom of the corresponding contact hole is electrically connected to ground or to an n-diffusion region. Feature 510 is of intermediate diameter, as material at the bottom of the corresponding contact hole is electrically connected to a gate region. Feature 515 is of the smallest diameter, as material at the bottom of the contact hole is electrically connected to an n-well region or a p-diffusion region. Though the contact holes are of identical physical dimensions, their representations in the voltage-contrast image of FIG. 5 exhibit characteristics which allow them to be distinguished by electrical connectivity of the material at the base of the unfilled contact hole.

We term this effect voltage-contrast-induced feature enlargement: contacts electrically connected to ground or to n-diffusion regions have the largest size in the negative-voltage-contrast image, contacts electrically connected to gates have medium size in the negative-voltage-contrast image, and contacts of n-well or p-well diffusion regions have the smallest size in the negative-voltage-contrast image. With the use of appropriate parameters in negatively charging the surface of a structure, its apparent feature size in a voltage-contrast image depends on its electrical connectivity. Apparent feature size in the voltage-contrast image of structural features having the same physical size can reveal connectivity problems; this is especially true when the apparent feature size of a feature such as a contact hole is compared with other information about the structural feature. Such other information can include the expected physical size and connectivity (available for example from wafer and circuit design data) and the apparent feature size in a voltage-contrast image taken without first charging-up the structure (as in FIG. 3).

For example, the contact holes represented in FIGS. 3 and 5 are known to have about the same appearance in a conventional voltage-contrast image such as FIG. 3 which does not take account of the electrical connectivity of the material at the base of the contact hole. It can be inferred from the conventional voltage-contrast image of FIG. 3 that the contact holes are of about the same physical dimensions. However, the same contact holes are known to have different apparent sizes in the feature-enlarged voltage-contrast image of FIG. 5 due to the effect of negatively charging-up the surface prior to imaging. Electrical connectivity of the material at the bottom of each contact hole can be inferred from the apparent size of the contact hole's representation in the feature-enlarged voltage-contrast image of FIG. 5.

The expected electrical connectivity of each contact hole can be obtained from design data for the wafer, so that differences between the expected connectivity and the connectivity inferred from the apparent size of a feature in a feature-enlarged voltage-contrast image can be identified as defects. A defect can be readily identified if its apparent size is different than expected because of electrical faults such as a short-fault at a gate region, an open-fault at a contact to a ground region or an n-diffusion region, or an open-fault or short-fault at an n-well or p-diffusion contact region. Because these apparent-size differences are derived from the electrical performance of material at the bottom of the contact hole, the differences have a high likelihood of affecting electrical performance of the finished IC's of the wafer and thus of representing "killer" defects. Discovery of such defects at the contact-hole stage of wafer fabrication, before contact holes are filled, can in many cases allow for re-work and consequent salvaging of some or all of the IC's on the wafer which would otherwise contribute to low production yield. Failure to discover such defects until wafer completion can result in total or partial loss of the wafer since re-work is then no longer possible.

Employing feature-enlarged voltage-contrast images to inspect high-aspect-ratio micro-circuit features by apparent size (rather than by contrast level as in conventional voltage-contrast imaging) has at least two significant advantages: high throughput and simplified particle-beam column design. Throughput is increased because the particle-beam column can operate at higher beam current for feature-enlarged voltage-contrast imaging than for conventional voltage contrast imaging. Column design is simplified because there is no need to integrate a specific component for extracting secondary electrons from contact holes into the already complex particle-beam column design.

In a conventional voltage-contrast image, the image contrast is due to a convolution of surface voltage and surface structure geometry (material contrast and topographic contrast). In many cases, the voltage distribution matches with structure geometry. Voltage distribution and structure geometry do not always match, however, since the electric field on a conductor can extend beyond its geometry. For electrical-defect detection, it is therefore advantageous to enhance the contrast due to voltage over the contrast due to geometry, since only the contrast due to voltage is affected by the underlying electrical connection. This differs from conventional charged-particle voltage-contrast metrology and microscopy which are optimized to image physical features. The contact holes in the negative-voltage-contrast image of FIG. 5 have different apparent dimensions because the potential on the oxide surface near the rim of each contact hole is affected by the charge-up potential on the material at the bottom of the respective contact hole, which is in turn determined by its underlying electrical connectivity. The contact hole on the left charges up negatively because it is connected to a gate region. The contact hole on the right remains at near ground because charge was drained to the substrate due to forward bias between the n-diffusion region and the substrate. Potential around the rim of the contact hole on the right is more negative because the electric field induced by the charged-up material at the bottom of the contact hole extends beyond the physical dimension of the contact hole, causing the rim of the contact hole on the right to have brighter contrast than the rim of the contact hole on the left. Darker contrast of the rim of the contact hole on the left results in a larger apparent dimension for that contact hole, as shown at 505 in FIG. 5.

Figure 6A:
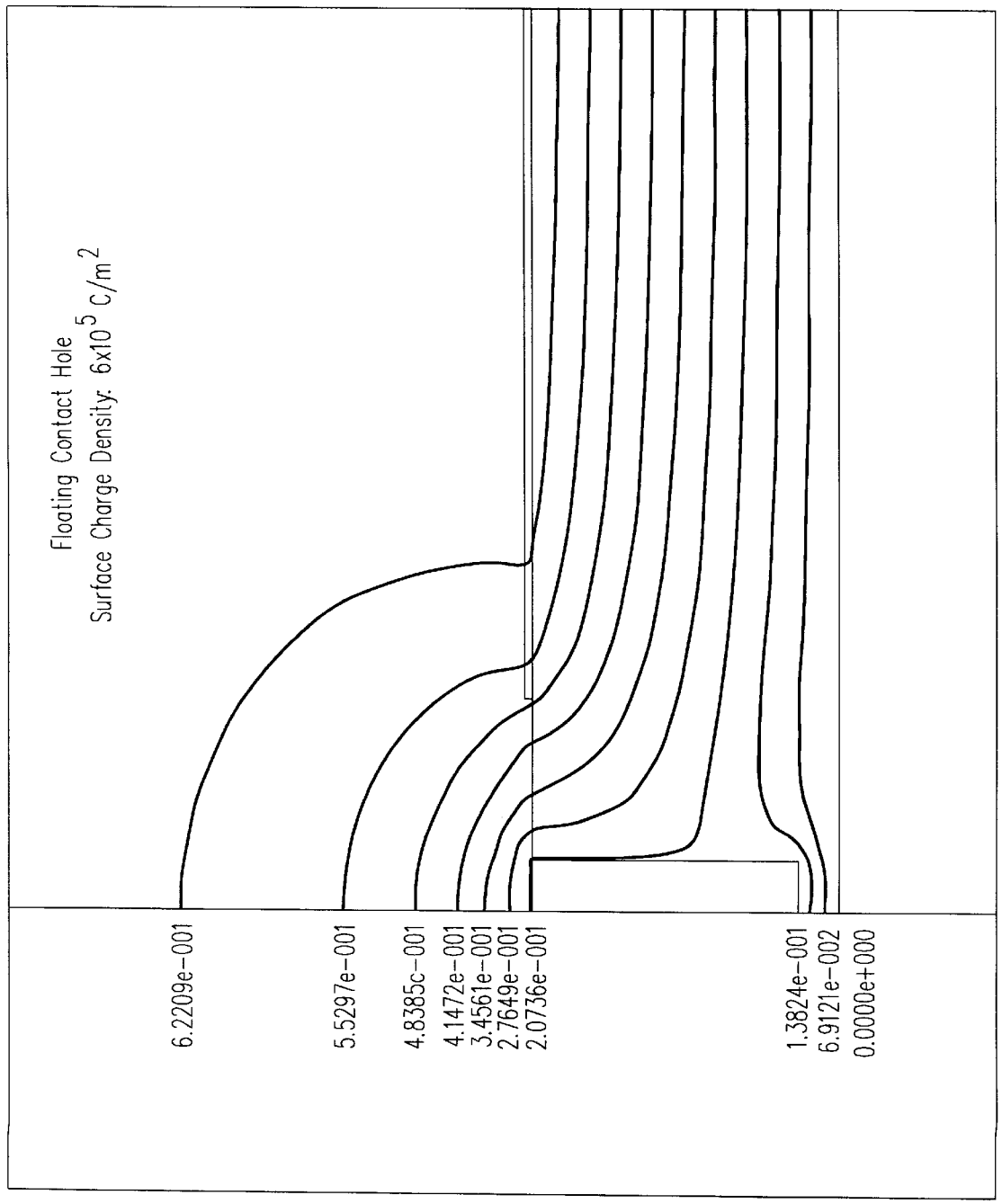
FIGS. 6A, 6B and 6C show simulated electric-field equipotential lines respectively surrounding floating, charged, and grounded contact holes with the adjacent surface negatively charged.
Figure 6B:
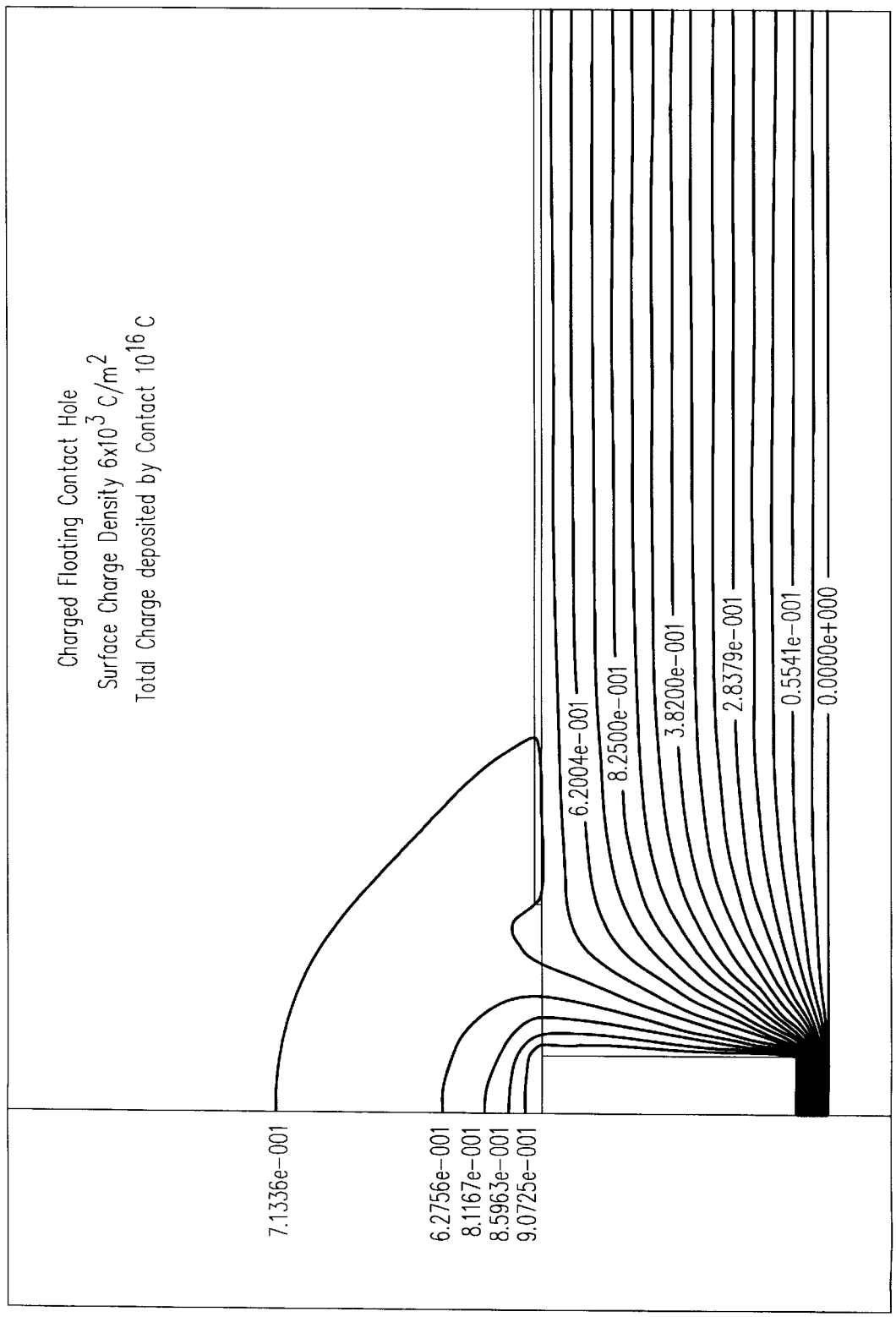
Figure 6C:
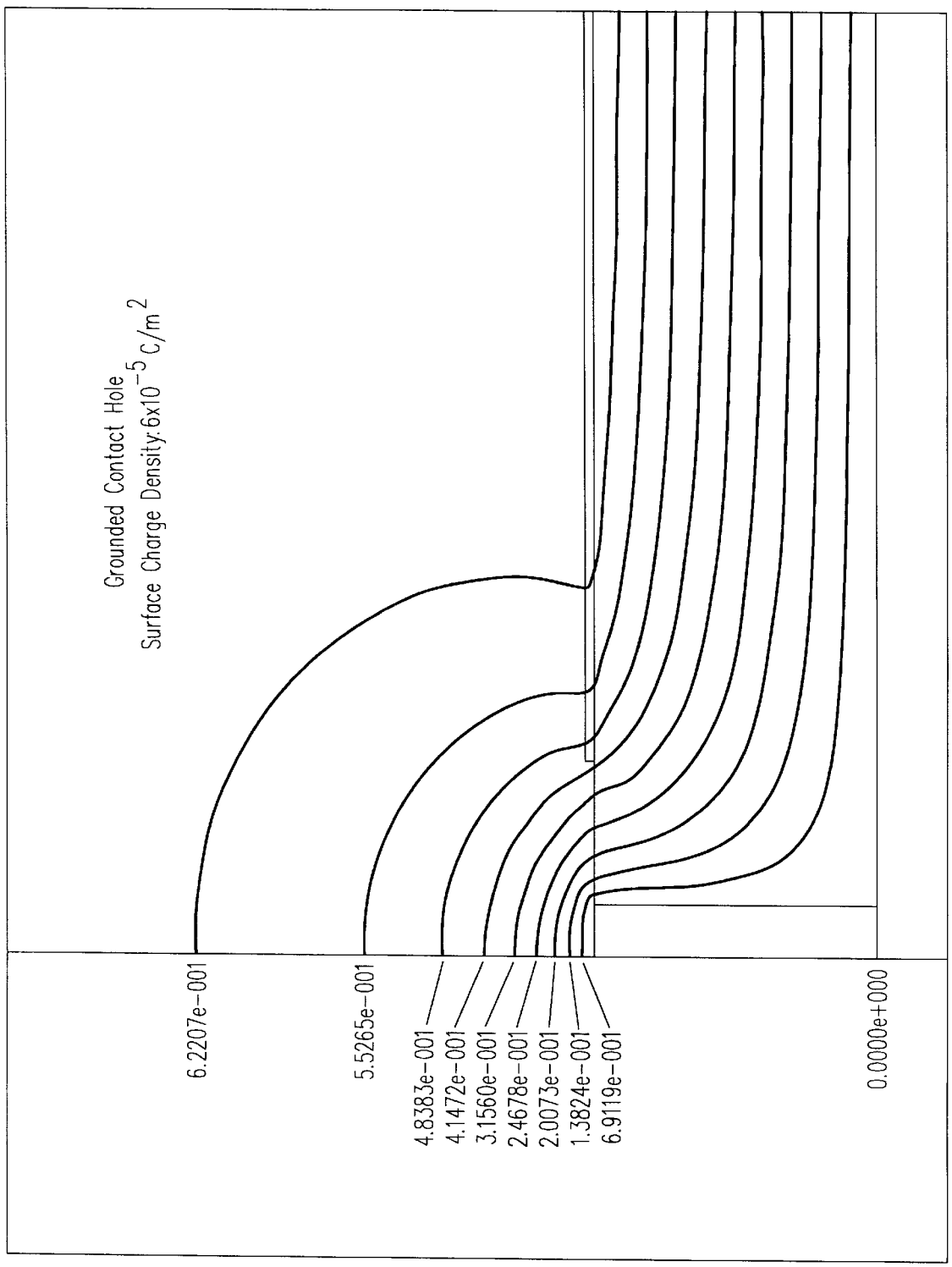

The point is further illustrated in the plots of FIGS. 6A, 6B and 6C. The plots are calculated simulations of electric-field equi-potential lines surrounding a contact hole, with the cylindrical contact hole shown at the left of each plot. The potential and charges are negative in the plots of FIGS. 6A, 6B and 6C. FIG. 6A shows the potential surrounding an uncharged floating contact hole, in which the wall of the contact hole is assumed to be coated with a conductive adhesive/barrier layer. In FIG. 6A, the surface is deposited with charge density of $-6\times10^{-5}$ coulomb/m$^2$. FIG. 6B shows the potential surrounding a charged contact hole. In FIG. 6B, the surface is deposited with charge density of $-6\times10^{-5}$ coulomb/m$^2$ and there is a charge of $-1\times10^{-16}$ coulomb/m$^2$ in the contact hole. FIG. 6C shows the potential surrounding a grounded contact hole. In FIG. 6C, the surface is deposited with charge density of $-6\times10^{-5}$ coulomb/m$^2$ and the contact hole is grounded to the substrate. It is apparent that the potential near the rim is most negative for the charged floating contact hole of FIG. 6B, and least negative for the grounded contact hole of FIG. 6C. Less negative potential around the rim contributes to a darker rim surrounding the contact hole in the voltage-contrast images. The apparent size of the contact hole in the voltage-contrast images is greater than its physical size because of the combined electric field of the rim and the contact hole. The simulations of FIGS. 6A, 6B and 6C show that the apparent size of the contract hole is sensitive to the underlying electrical connections and the charges injected into the contact hole.

It is advantageous to adjust ("tune") the charging control parameters so as to maximize the artifacts which result in an apparent feature size different from the physical size. Tuning optimization can be divided into two classes: (1) charging and (2) imaging. In the system described above, charging can be performed by the primary (imaging) beam or a separate flood beam. For voltage-contrast systems which have only an imaging beam, charging can be carried out while imaging.

To obtain maximum feature enlargement effect, surface charging must be properly controlled. Excessive surface charging can result in unrecognizable features, while insufficient charging fails to provide feature enlargement needed for detection of electrically-significant defects. As described above, surface charging can be controlled by the potentials applied to the wafer chuck and charging control plate, charging/imaging area, and energy filter. Other known factors, such as primary-beam and flood-beam voltages, scan rotation (scan direction relative to the wafer), and pixel dwell time should also be considered.

Surface-charging mechanisms for these parameters are:

(1) Bias Voltage: The voltage between the wafer chuck and the charging plate are used to control the equilibrium charging potential on the surface. A bias voltage between the charging plate and the wafer chuck rejects some of the emitted secondary electrons back to the surface until the surface charges up sufficiently negatively to offset the influence of the bias field.

When imaging microstructures of the same physical size but with different underlying electrical connections to p and n diffusion, gate, isolation well, etc., the system is operated in positive voltage-contrast mode, then switched to negative voltage-contrast mode, then the bias voltage (charging plate relative to wafer chuck) is adjusted until the difference between the apparent feature size of these structures is maximized. A typical starting bias voltage is −8 volts. A likely tuning range is between 0 to −15 volts.

(2) Beam Current Density: In situations where the circuit can be resistively connected to ground or there exists a leakage path between surface insulator and ground, current density plays a role in surface charging. The final charging potential is reached when the input current (current due to the flood gun and the primary beam) is equal to the leakage current (through the device) and escape electron current (secondary electrons and elastic-scattered primary electrons). Higher current density allows a higher final voltage being reached at equilibrium. A typical starting current density is 0.2 pico-ampere per square micron, e.g., 2 nano-amperes into a 100 micron× 100 micron square. A likely tuning range is from 0.5 nA to 20 nA per 100 micron×100 micron square.

(3) Charging/flood/imaging area: Surface charging depends in large part on the charging/imaging area, in particular when a large portion of the surface is covered by insulative material. In this case, the rejected charges in the area surrounding the beam-irradiated area can create a strong, localized field which retards secondary electron emissions in the irradiated area; this results in negative charging. Charging area can alter this local field strength which, in turn, affects the final charging potential. The area (sometimes called "Field of View" or "FOV") is adjusted while keeping the current density constant. A typical starting area is 200 microns×200 microns. A likely tuning range is from 1 mm×1 mm to 10 microns×10 microns.

(4) Beam energy: Charging in the beam-irradiated area is governed by the difference between input charge flux (due to primary-beam injection into the surface and returned secondary electrons) and output charge flux (secondary electron emission and surface leakage). Beam energy affects charging because secondary electron emission is a function of beam energy.

Beam voltage can be stepped in intervals of ~50 volts within a likely range of 500–1800 volts, stopping when the feature enlargement effects are suitable for defect detection purposes, i.e., when apparent feature size is obviously different for structure having different underlying electrical connectivity. Caution should be exercised against device damage when varying the beam voltage. If the selected beam voltage is too low or too high (e.g., lower than the first cross over point E1 or higher than the second cross over point E2 in the secondary electron yield curve, respectively, where E1 and E2 are material dependent and extremely sensitive to surface processing), the surface may charge up negatively but in an non-regulated manner. In extreme cases, the surface could charge up severely enough to damage the device. This can be seen when the charging control scheme can no longer control the surface charging; it is therefore advisable to tune the beam voltage using an inexpensive, expendable test wafer. When tuning has to be done on a regular wafer, it is advisable to first check the E1 and E2 curve of the topmost material from the published literature and operate with the beam voltage between the published values of E1 and E2.

(5) Scan rotation: Localized field (within microns of the area of interest) can influence the secondary electron escape rate and, therefore, affect charging. Strong localized fields can come from nearby structures that were scanned over in the same line scan, because these structures are freshly charged. Changing the scan rotation varies the nearby "freshly" charged neighbors of a structure and thus the charging condition on the structure. Any starting angle can be used, e.g., the origentation when the beam is turned on. A likely tuning ranging varies from −180 degrees to +180 degrees. The intent is to tray all scan rotation orientations to make sure that the best is being used. In practice, the system can be set initially so that imaging of lines and contacts is parallel to the image orientation, though this is not required.

(6) Pixel dwell time: As noted above, localized fields play a role in surface charging due to freshly-charged-up neighboring structures. The voltage for these charged-up neighboring structures is a function of the pixel dwell time. Changing pixel dwell time thus affects charging of a structure. A typical starting dwell time is 0.1 $\mu$second, which is then increased or decreased to enhance the feature enlargement effect. A likely tuning range is from 0.01 $\mu$s to 1 $\mu$s.

After the charging parameters are set, the feature enlargement effect can be further optimized by tuning the energy filter, an imaging parameter. Field enlargement effect results from secondary electrons captured by the strong field which extends beyond the physical dimension of a charge-up circuit. For instance, the field from a charged-up contact hole can retard secondary electrons in the near neighborhood from reaching the secondary-electron detector. This contributes to dark contrast in the neighborhood of the contact hole. In some situations, the field is not strong enough to capture the secondary electrons. Instead, it brings down the energy of the emitted electrons. By tuning the energy filter, subtle changes in the field are reflected in the image contrast.

Optimization procedures consistent with the invention are summarized below in Table I. The procedures may be used as needed to optimize feature enlargement effect. Acceptable results can be obtained in some instances without employing all the listed procedures. Though the procedures have been found to work well when performed in the order given below, especially when repeated through several iterations, they may be ordered differently as desired to produce apparent feature size different from physical size. Thus, the order and precise composition of the procedures, and their ranges of values, are intended as illustrative but not as limiting.

TABLE I

| Tuning Charging | Procedure | Values |
|---|---|---|
| A. | | |
| voltage offset between charging control plate and wafer chuck | adjust voltage to maximize feature enlargement effects (maximizing feature size differences between circuit of the same physical size but different underlying connectivity | typical: −8 volts likely range: 0 volt to −15 volts |
| charging/flood/imaging current density | adjust current to maximize feature enlargement effects | typical: 2 nA per 100 $\mu$m × 100 $\mu$m FOV likely range: 0–20 nA per 100 $\mu$m × 100 $\mu$m FOV |
| charging/flood/imaging area | adjust area to maximize feature enlargement effects | typical: 200 $\mu$m × 200 $\mu$m FOV likely range: 1 mm × 1 mm to 10 $\mu$m ×10 $\mu$m FOV |
| beam energy | adjust beam energy to maximize feature enlargement effects | adjust in ~50 V steps likely range: 500 V to 1800 V (remain between E1 and E2) |
| charging/image scan rotation | adjust scan rotation angle relative to wafer to maximize feature enlargement effects | typical: 0 degree likely range: −90 to +90 degrees |
| pixel dwell time | adjust to maximize feature enlargement effects | typical 100 ns range: 10 ns to 1 $\mu$s |
| B. | | |
| energy filter | adjust energy to maximize feature enlargement effects | typical: 0 volt likely range: +5 volts to −15 volts (with respect to wafer chuck voltage) |

After completing the optimization procedures, the system is ready for defect detection based on voltage-contrast-induced feature enlargement effect. Images of a microstructure, such as in-process wafer having unfilled contact holes, are acquired by operating the system with the optimized parameters. Each acquired image is compared to a reference. A defect is detected, for example, if the apparent size of a feature in the acquired image differs significantly from that of the reference. Several comparison schemes are possible, as summarized in Table II.

TABLE II

| | |
|---|---|
| Cell to Cell | Typically used for memory cells. (1) An image of each cell in a memory array is compared with an image of a perfect (known good) reference cell, or (2) an image of each memory cell is compared with an image of its neighbor. Comparison can be individual cell to individual cell, or can be section by section, where a section is some repeating structure such as 2 or 4 symmetrically reflected cells. |
| Die to die | This is typically the standard mode of operation for an optical inspection system such as the KLA213X. An image of each die is compared to an image of its adjacent neighbor during the scanning process. An image of a third die is then used to arbitrate which die actually has the defect. This works well for random defects but cannot find repeating defects such as extra pattern in a tightly-routed section of the mask. In general (though not with KLA's SEMSpec systems) an image of any die can be compared to an image of any other die and an image of any third die can be used for arbitration. "Die to and die" comparisons are valuable as they can be used to target specific areas of the wafer with a particular expected defect type and compare against a die that is likely to be good. For example, edge die to center die comparison is desirable because die near the edge of a wafer are more prone to defects and have lower yield than do die nearer the center of a wafer. |
| Die to golden die | Image data or other data from a known-good ("golden") reference die is stored and used as a reference against which an image of the die under inspection is compared. The storage space required for image data is high (e.g., tens of GBytes), though disk and memory space is becoming cheaper and voltage contrast images can be compressed. A golden reference die requires no arbitration. |
| Die to database | This is similar to a technique used in mask inspection. When used with "apparent-feature-enlarged" images, multiple layers of the database and knowledge of the electrical properties of the circuit represented are used to determine which features are expected to be electrically grounded and which are expected to be electrically floating in negative charge mode, i.e., which p-n junctions are forward biased by the negative potential or voltage. |
| Block to block | Essentially the same as die-to-die comparison except that it covers one or more subsections of a die. For example, an image of a particular portion of a die which is known or expected to be more likely to generate a particular type of defect of interest is compared to the corresponding part of an image of a reference die. Arbitration with an image of a third die is used as appropriate. This approach saves processing time versus full die-to-die comparison. |

Figure 7:
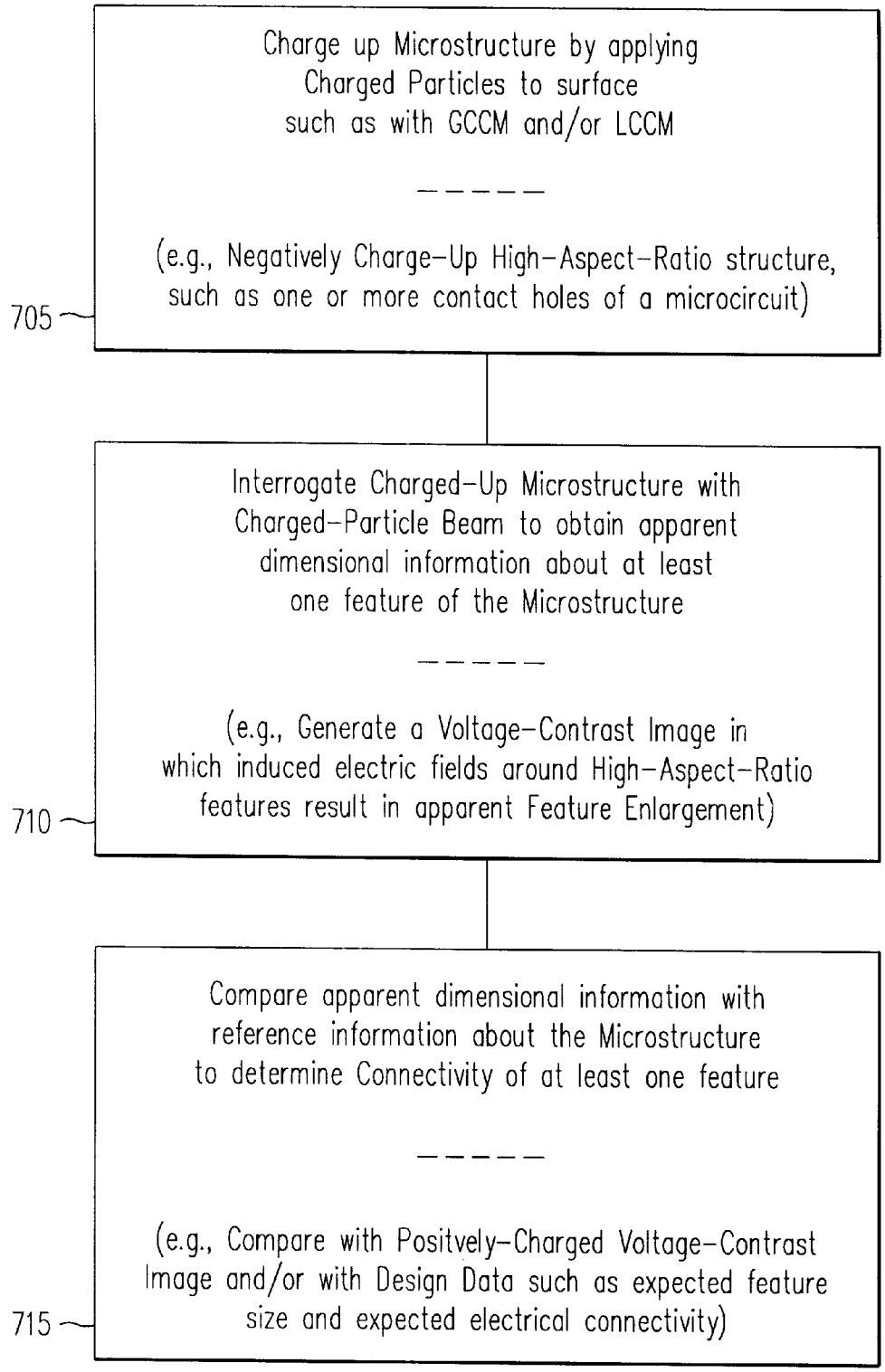
FIG. 7 is a flow chart showing principal features of a method consistent with the present invention.

FIG. 7 is a flow chart showing some principal features of methods consistent with the present invention. In step 705, a microstructure is charged up using appropriate charging parameters, e.g., as discussed above. This can be done by applying charged particles to the surface of the microstructure, such as by operation of the global charge-control module (GCCM) and/or the local charge-control module (LCCM) described above with reference to FIG. 1, with the parameters tuned to assure enlargement of apparent feature size. For example, a high-aspect-ratio microstructure such as one or more contact holes of a microcircuit is negatively charged up by application of an electron beam or electron flood, with the aid of appropriate electric fields as described above with reference to FIG. 1.

In step 710, the charged-up microstructure is interrogated with a charged-particle beam to obtain information about at least one feature of the microstructure. For example, a focused electron beam or focused ion beam is applied to the microstructure as secondary particles are detected so as to generate a voltage-contrast image. Electric fields around charged-up high-aspect-ratio features result in a voltage-contrast image in which apparent feature sizes are dependent on electrical connectivity of material within or beneath the features. For example, negatively-charged-up contact hole structures of substantially identical physical dimensions will have the largest apparent size in the voltage-contrast image if they have a bottom surface electrically connected to ground or to n-diffusion regions, will have intermediate apparent size in the voltage-contrast image if they have a bottom surface electrically connected to gate regions, and will have smallest apparent size in the voltage-contrast image if they have a bottom surface electrically connected to n-well or p-well diffusion regions.

In step 715, information obtained from interrogating the charged-up microstructure is compared with other information about the microstructure to determine connectivity of at least one feature of the microstructure. For example, the apparent size of a feature imaged in the interrogation (as in FIG. 5) is compared with the apparent size of the same feature in a voltage-contrast image obtained with the same microstructure or a reference microstructure charged-up positively (as in FIG. 3), and electrical connectivity is inferred from the difference of apparent size. Alternatively, the apparent size of a feature imaged in the interrogation (as in FIG. 5) is compared with design data indicating designed feature size and expected connectivity. If the apparent feature size is not consistent with the design data, a defect can be inferred.

A high-aspect-ratio structure is considered to be one in which the ratio of depth to width is greater than unity. For typical microstructures to be inspected with a charged-particle-beam, such as microcircuits constructed using present technology, the hole depth is typically in the range from one micron down to about 0.18 micron. However, principles of the present invention can be applied to structures having larger or smaller aspect ratios and/or having dimensions outside such range.

While an embodiment consistent with the invention has been described in connection with inspection of unfilled contact holes of a semiconductor wafer, methods consistent with the invention can be employed to inspect filled contact holes and other structures in which electrical connectivity will influence apparent feature size, such as "via" holes in a wafer. While a contact hole is intended to be filled with metal for establishing contact with the substrate (or diffusion regions of the substrate) or with a gate region, a "via" hole is intended to be filled with metal for establishing contact between metal layers, such as between a conductive line of a metal1 layer and a conductive line of a metal2 layer. As used herein, the term "feedthrough" hole means a contact hole or a via hole or any other hole through an insulating layer intended to be filled with conducting material.

As described above, the system of FIG. 1 is controlled by control system 40, which is in turn controlled by computer 42 having a data store 44. Methods consistent with the present invention can be carried out through execution by computer 42 of application code (computer-readable instructions) embodied in any form of computer program product. A computer program product comprises a medium configured to store or transport computer readable code, or in which computer readable code may be embedded. Some examples of computer program products are CD-ROM disks, ROM cards, floppy disks, magnetic tapes, computer hard drives, servers on a network, and carrier waves. Comparison functions described herein can be carried out in computer 42 and/or in other computer systems as desired.

The systems described above are for purposes of example only. An embodiment consistent with the invention may be implemented in a charged-particle-beam system having any type of computer system or programming or processing environment.

Those of skill in the art will recognize many modifications which can be made within the spirit and scope of the invention as defined in the claims.

What is claimed is:

1. A method of inspecting a semiconductor wafer, comprising:
   a. applying low energy charged particles of less than 3 keV to the wafer to negatively charge up the wafer over a region having at least two feedthrough holes, a first feedthrough hole having a physical diameter of substantially the same size as that of a second feedthrough hole, the first hole being disposed over a material having an electrical connectivity different from that of the second hole;
   b. scanning a charged-particle beam over said negatively charged region while detecting secondary particles to produce a detector signal;
   c. determining from the detector signal apparent diameters of the at least two feedthrough holes, the apparent diameter of the first hole differing in size from the physical diameter of the first hole because of a surface potential surrounding the first hole; and
   d. comparing the apparent diameters of at least two feedthrough holes with reference information to identify a defect.

2. The method of claim 1, wherein said reference information comprises a voltage-contrast image.

3. The method of claim 1 wherein applying charged particles to the wafer comprises directing a flood of electrons toward a surface of the wafer.

4. The method of claim 1 wherein applying charged particles to the wafer comprises setting potential of an energy filter so as to direct secondary electrons back to the wafer while directing a charged-particle beam at the wafer.

5. The method of claim 1 wherein applying charged particles to the wafer comprises irradiating the wafer with electrons having energy less than about 50 volts.

6. A method of inspecting a microstructure, comprising:
   a. charging up a microstructure;
   b. interrogating the charged microstructure with a charged-particle beam to obtain an apparent dimension for at least one high aspect ratio feature of the microstructure, the apparent dimension differing in size from an actual physical dimension of the high aspect ratio feature as a result of a surface potential surrounding the high aspect ratio feature, the surface potential being affected by an electrical connectivity of a material proximate the high aspect ratio feature; and c. comparing said apparent dimension with reference information about the microstructure to identify a defect.

7. The method of claim 6 wherein charging up a microstructure comprises applying charged particles to the microstructure to negatively charge up said at least one feature.

8. The method of claim 6 wherein charging up a microstructure comprises applying a flood of electrons to the surface of the microstructure.

9. The method of claim 6 wherein charging up a microstructure comprises setting a potential of an energy filter so as to direct secondary electrons back to the microstructure while interrogating the microstructure with a charged-particle beam.

10. The method of claim 6 wherein charging up a microstructure comprises irradiating the microstructure with electrons having energy less than about 50 volts.

11. The method of claim 6 wherein interrogating the microstructure comprises generating a voltage-contrast image of a surface region of the microstructure from which said apparent dimension can be determined.

12. The method of claim 6 wherein interrogating the microstructure comprises scanning a charged-particle-beam over a surface region of the microstructure while detecting charged particles emanating from the surface region to create a voltage-contrast image of the surface region.

13. The method of claim 6 wherein comparing said apparent dimension with reference information about the microstructure comprises comparing an apparent size of said at least one feature with an expected size.

14. The method of claim 6 wherein comparing said apparent dimension with reference information about the microstructure comprises determining whether the apparent size of said at least one feature is consistent with an expected electrical connectivity of the material within or beneath said at least one feature.

15. The method of claim 6 wherein comparing said apparent dimension with reference information about the microstructure comprises comparing the apparent size of said at least one feature with a size of said feature in a conventional voltage-contrast image.

16. The method of claim 6, further comprising the step of obtaining a conventional voltage-contrast image of the microstructure, wherein interrogating the microstructure comprises generating a feature-enlarged voltage-contrast image of a surface region of the microstructure, and wherein comparing said apparent dimension with reference information about the microstructure comprises comparing an apparent size of said at least one feature in the conventional voltage-contrast image with an apparent size of said at least one feature in the feature-enlarged voltage-contrast image.

17. A computer-readable medium containing instructions for controlling a charged-particle-beam system to perform a method for inspecting a semiconductor wafer, the method comprising:

a. applying low energy charged particles of less than 3 keV to the wafer to negatively charge up the wafer over a region having at least two feedthrough holes, a first feedthrough hole having a physical diameter of substantially the same size as that of a second feedthrough hole, the first hole being disposed over a material having an electrical connectivity different from that of the second hole;

b. scanning a charged-particle beam over said negatively charged region while detecting secondary particles to produce a detector signal;

c. determining from the detector signal apparent diameters of the at least two feedthrough holes, the apparent diameter of the first hole differing in size from the physical diameter of the first hole because of a surface potential surrounding the first hole; and d. comparing the apparent diameters of said at least two feedthrough holes with reference information to identify a defect.

18. A computer program product comprising a computer usable medium having computer-readable program code embodied therein for controlling a charged-particle-beam system comprising:

a. computer-readable program code configured to cause the charged-particle-beam system to charge up a microstructure, the microstructure having at least one high aspect ratio feature;

b. computer-readable program code configured to cause the charged-particle-beam system to interrogate the charged microstructure with a charged-particle beam to obtain an apparent dimension for at least one feature of the microstructure, the apparent dimension differing in size from an actual physical dimension of the feature as a result of a surface potential surrounding the high aspect ratio feature, the surface potential being affected by an electrical connectivity of a material proximate the high aspect ratio feature; and c. computer-readable program code configured to cause the charged-particle-beam system to compare said apparent dimension with reference information about the microstructure to identify a defect.

19. The method of claim 6, wherein the at least one feature is one of an unfilled contact hole of a semiconductor wafer, and a filled contact hole of a semiconductor wafer.

20. The method of claim 6, wherein the interrogating is performed with a field of view in the range of 0.25 mm to 1.5 mm.

21. The method of claim 6, wherein the charging up the microstructure includes applying a voltage to the microstructure.

22. A method of inspecting a semiconductor wafer, comprising:

a. negatively charging a region of the wafer, the region having a first feedthrough hole and a second feedthrough hole, the first hole having a first physical diameter and being disposed over a first material having a first electrical connectivity, the second hole having a second physical diameter and being disposed over a second material having a second electrical connectivity, the first electrical connectivity differing from the second electrical connectivity, the first and second physical diameters being substantially equal;

b. scanning a charged-particle beam over the negatively-charged region while detecting secondary particles to produce a detector signal; and c. determining from the detector signal apparent diameters of the first and second holes, the apparent diameter of the first hole differing in size from the apparent diameter of the second hole, wherein the apparent diameters of the first and second holes are affected by the materials underlying the respective holes, the apparent diameters providing information as to the first and second materials located beneath the respective first and second holes.

23. The method of claim 22, further comprising comparing the apparent diameters of the first and second holes with reference information to identify a defect.

24. The method of claim 22, further comprising optimizing at least one parameter affecting a feature enlargement effect to differentiate between the size of the apparent diameters of the first and second holes.

25. The method of claim 24, wherein optimizing the at least one parameter includes adjusting a voltage to enhance the feature enlargement effect.

26. The method of claim 24, wherein optimizing the at least one parameter includes adjusting a current to enhance the feature enlargement effect.

27. The method of claim 24, wherein optimizing the at least one parameter includes adjusting a charging/imaging area to enhance the feature enlargement effect.

28. The method of claim 24, wherein optimizing the at least one parameter includes adjusting a beam energy to enhance the feature enlargement effect.

29. The method of claim 24, wherein optimizing the at least one parameter includes adjusting an energy filter to enhance the feature enlargement effect.

30. The method of claim 22, wherein negatively charging the wafer includes applying low energy charged particles of less than approximately 50 eV.

31. The method of claim 30, wherein the low energy charged particles are applied using a global charge control module.

32. The method of claim 30, wherein the low energy charged particles are applied using a local charge control module.

33. A method of inspecting a semiconductor wafer, comprising:
 a. negatively charging a region of the wafer, the region having a first feedthrough hole and a second feedthrough hole, the first hole having a first physical diameter and being disposed over a first material having a first electrical connectivity, the second hole having a second physical diameter and being disposed over a second material having a second electrical connectivity, the first electrical connectivity being different from the second connectivity, the first and second diameters being substantially equal;
 b. scanning a charged-particle beam over the negatively-charged region while detecting secondary particles so as to produce a detector signal;
 c. constructing from the detector signal an image of the region of the wafer;
 d. determining apparent diameters of the first and second holes;
 e. optimizing at least one parameter to enhance a feature enlargement effect to differentiate between the size of the apparent diameters of the first and second holes, the apparent diameters of the first and second holes providing information as to the first and second materials located beneath the respective first and second holes; and
 f. comparing the apparent diameters of the first and second holes with reference information to identify a defect.

34. The method of claim 33, wherein optimizing at least one parameter includes adjusting at least one of a voltage, a current, a charging/imaging area, and a beam energy to enhance the feature enlargement effect.

35. The method of claim 33, wherein optimizing at least one parameter includes adjusting an energy filter to enhance the feature enlargement effect.

36. The method of claim 33, wherein negatively charging up the wafer includes applying low energy charged particles of less than approximately 50 eV.

37. The method of claim 1, wherein applying charged particles to the wafer comprises:
 disposing the wafer between two electrodes; and
 applying an electric field to the wafer to retain secondary electrons and negatively charge the wafer.

38. The method of claim 37, wherein applying the charged particles is accomplished using a global charge control module.

39. The method of claim 37, wherein applying the charged particles is accomplished using a local charge control module.

40. The method of claim 3, wherein the flood of electrons is directed toward the surface of the wafer using a primary beam.

41. The method of claim 3, wherein the flood of electrons is directed toward the surface of the wafer using a flood gun.

42. The method of claim 7, wherein applying charged particles comprises:
 disposing the wafer between two electrodes;
 applying an electric field to the wafer to retain secondary electrons and negatively charge the wafer.

* * * * *